US012660693B2

(12) United States Patent
Ray et al.

(10) Patent No.: US 12,660,693 B2
(45) Date of Patent: Jun. 16, 2026

(54) INTEGRATION OF DISCRETE EMBEDDABLE CAPACITORS ON INTEGRATED CIRCUIT CHIPS

(71) Applicant: Murata Manufacturing Co., Ltd., Kyoto (JP)

(72) Inventors: Shishir Ray, San Diego, CA (US); Anil Kumar, San Diego, CA (US); Sinan Goktepeli, Austin, TX (US); Kouassi Sebastien Kouassi, San Diego, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 708 days.

(21) Appl. No.: 17/975,864

(22) Filed: Oct. 28, 2022

(65) Prior Publication Data

US 2024/0145447 A1 May 2, 2024

(51) Int. Cl.
*H10B 43/27* (2023.01)
*G11C 11/408* (2006.01)
(Continued)

(52) U.S. Cl.
CPC ............ *H10W 90/00* (2026.01); *H10D 1/042* (2025.01); *H10D 1/714* (2025.01); *H10D 1/716* (2025.01);
(Continued)

(58) Field of Classification Search
CPC . H01L 23/49589; H01L 23/642; H01G 4/232; H01G 4/30; H01G 4/33;
(Continued)

(56) References Cited

U.S. PATENT DOCUMENTS 6,327,134 B1 * 12/2001 Kuroda ................... H01G 4/30
361/308.1
9,449,931 B2 * 9/2016 Lin ......................... H01L 24/13
(Continued)

FOREIGN PATENT DOCUMENTS

| EP | 1137332 | 9/2001 |
| JP | 2001332437 | 11/2001 |
| WO | 02/03463 | 1/2002 |

OTHER PUBLICATIONS

Min, et al., "Embedded Capacitors in the Next Generation Processor",2013 Electronic Components & Technology Conference, pp. 1225-1229.

(Continued)

*Primary Examiner* — Wael M Fahmy
*Assistant Examiner* — Aneesa Riaz Baig
(74) *Attorney, Agent, or Firm* — Steinfl + Bruno LLP

(57) ABSTRACT

Single-chip solutions and related methods that result in much higher capacitance densities than is achievable with current on-chip solutions and which reduce consumption of planar area of a mounting structure. Embodiments of the present invention use vertical stacking to affix one or more discrete embeddable capacitors to an IC chip superstructure or base structure, and either sequentially or concurrently form electrical connections between the discrete embeddable capacitors and the IC chip. The inventive processes are compatible with CMOS fabrication temperatures for the IC chip while allowing use of capacitors that are fabricated using other processes that may involve much higher temperatures. The inventive processes allow connection of relatively large capacitances (e.g., ~0.5 μF-1 μF) to an IC chip without increasing the 2-D footprint of the IC chip. Some embodiments include reconfigurable discrete/affixed capacitors and/or discrete/affixed capacitors with through- (Continued)

vias (distinct from capacitor electrode connections) for connecting circuitry.

20 Claims, 16 Drawing Sheets

(51) Int. Cl.

| | |
|---|---|
| *G11C 11/412* | (2006.01) |
| *G11C 11/418* | (2006.01) |
| *H01L 21/768* | (2006.01) |
| *H01L 23/48* | (2006.01) |
| *H01L 25/00* | (2006.01) |
| *H01L 25/065* | (2023.01) |
| *H10B 41/27* | (2023.01) |
| *H10B 41/30* | (2023.01) |
| *H10B 41/35* | (2023.01) |
| *H10B 43/30* | (2023.01) |
| *H10B 43/35* | (2023.01) |
| *H10D 1/00* | (2025.01) |
| *H10D 1/68* | (2025.01) |
| *H10D 30/01* | (2025.01) |
| *H10D 30/67* | (2025.01) |
| *H10D 64/27* | (2025.01) |
| *H10W 72/00* | (2026.01) |
| *H10W 80/00* | (2026.01) |
| *H10W 90/00* | (2026.01) |

(52) U.S. Cl.
CPC .... *H10W 72/07232* (2026.01); *H10W 80/312* (2026.01); *H10W 80/327* (2026.01); *H10W 90/728* (2026.01); *H10W 90/798* (2026.01)

(58) Field of Classification Search
CPC ............ H01G 4/38; H01G 4/385; H01G 4/40; H01G 2/065; H10W 90/728; H10W 44/601

See application file for complete search history.

(56) References Cited

U.S. PATENT DOCUMENTS

| | | | | |
|---|---|---|---|---|
| 10,076,036 | B2 * | 9/2018 | Lee ........................... | H01G 2/06 |
| 10,818,435 | B2 * | 10/2020 | Lee ......................... | H01G 4/012 |
| 2002/0067587 | A1 | 6/2002 | Mosley | |
| 2004/0223289 | A1 * | 11/2004 | Kuroda .................. | H01G 4/232 |
| | | | | 361/306.1 |
| 2004/0257749 | A1 * | 12/2004 | Otsuka ................... | H05K 1/162 |
| | | | | 257/E23.079 |
| 2005/0230030 | A1 | 10/2005 | Prymak | |
| 2006/0274479 | A1 | 12/2006 | Radhakrishnan et al. | |
| 2008/0055872 | A1 * | 3/2008 | Inagaki .................... | H01G 2/06 |
| | | | | 361/760 |
| 2013/0094157 | A1 * | 4/2013 | Giuliano ............... | H10W 90/00 |
| | | | | 361/748 |
| 2013/0194032 | A1 * | 8/2013 | Hollis ................... | H03K 3/013 |
| | | | | 361/728 |
| 2014/0363966 | A1 * | 12/2014 | Lin ......................... | H01L 24/13 |
| | | | | 438/614 |
| 2015/0041198 | A1 * | 2/2015 | Lee .......................... | H01G 2/06 |
| | | | | 361/301.4 |
| 2016/0126934 | A1 * | 5/2016 | De Jongh ............... | H03J 5/244 |
| | | | | 334/55 |
| 2018/0190580 | A1 * | 7/2018 | Haba ................. | H01L 23/49827 |
| 2020/0083868 | A1 * | 3/2020 | Crandell .................. | H03H 7/40 |
| 2022/0173067 | A1 | 6/2022 | Sandstrom et al. | |
| 2022/0173090 | A1 | 6/2022 | Gomes et al. | |
| 2022/0223585 | A1 * | 7/2022 | Kim ...................... | H01L 25/105 |
| 2022/0344250 | A1 * | 10/2022 | Choi ..................... | H01L 21/486 |
| 2023/0011666 | A1 * | 1/2023 | Liang ..................... | H10D 1/716 |
| 2024/0145447 | A1 * | 5/2024 | Ray .......................... | H01G 4/38 |

OTHER PUBLICATIONS

Grigoras, et al., "Conformal Titanium Nitride in a Porous Silicon Matrix: A Nanomaterial for In-Chip Supercapacitors", 2016 The Authors, Published by Elsevier Ltd., 6 pgs.

Brown, Dock, Multilayer Ceramic Capacitors: Mitigating Rising Failure Rates, DfR Solutions, Dec. 5, 2018, 7 pgs.

Roozeboom, et al., "Ultrahigh-Density Trench Capacitors in Silicon and Their Application to Integrated DC-DC Conversion", Proceedings of the Eurosensors XXIII Conference, 2009, 5 pgs.

Uhrmann, et al., "Die-to-Wafer Bonding Steps into the Spotlight on a Heterogeneous Integration Stage", EV Group, Apr. 2021, 4 pgs.

Lescop, Emmanuelle, International Search Report and Written Opinion received from the EPO dated Feb. 20, 2024 for appln. No. PCT/US2023/077420, 15 pgs.

Elsherbini, et al., "Hybrid Bonding Interconnect for Advanced Heterogeneously Integrated Processors", 2021 IEEE 71st Electronic Components and Technology Conference (ECTC), pp. 1014-1019.

* cited by examiner

_200_

_300_

_320_

<u>400</u>

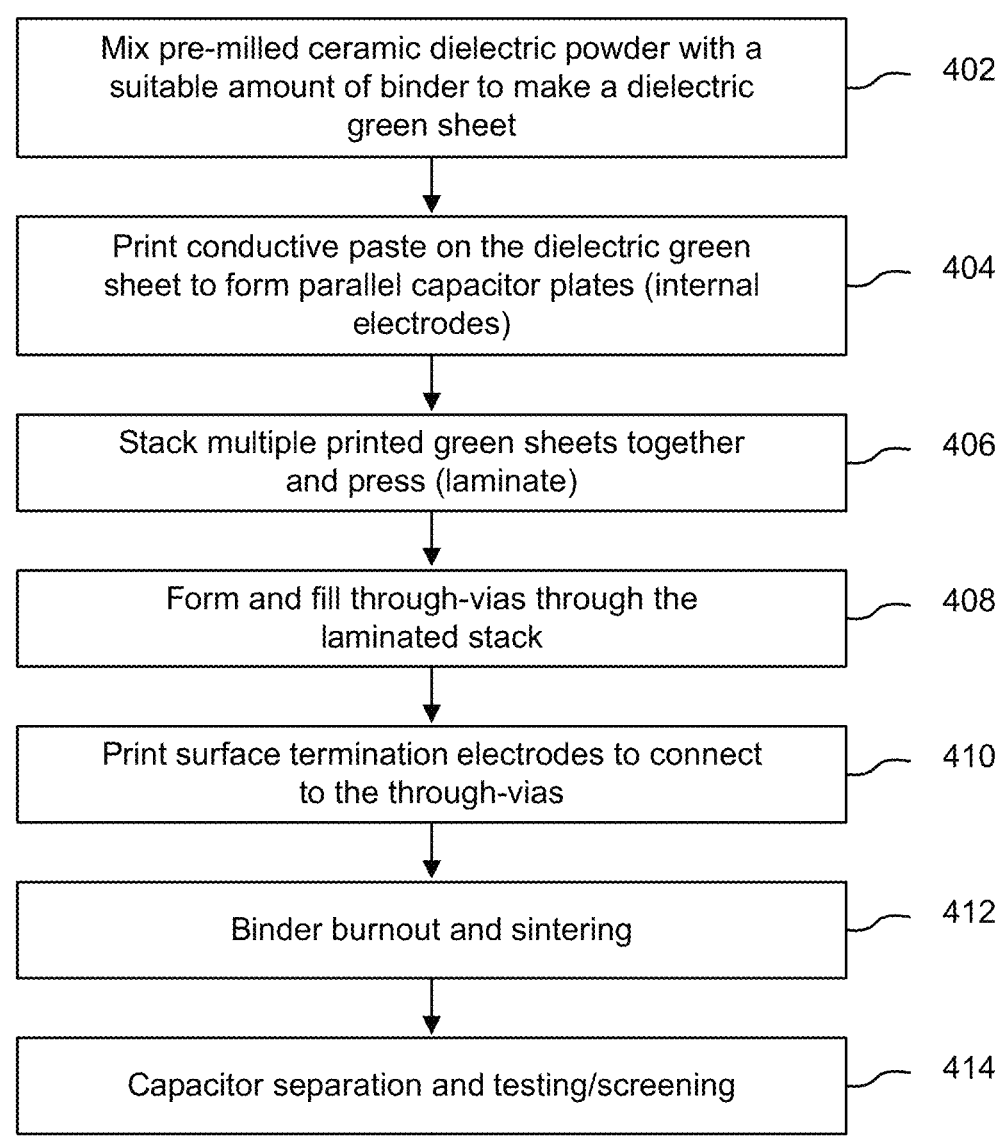

| Mix pre-milled ceramic dielectric powder with a suitable amount of binder to make a dielectric green sheet | 402 |

| Print conductive paste on the dielectric green sheet to form parallel capacitor plates (internal electrodes) | 404 |

| Stack multiple printed green sheets together and press (laminate) | 406 |

| Form and fill through-vias through the laminated stack | 408 |

| Print surface termination electrodes to connect to the through-vias | 410 |

| Binder burnout and sintering | 412 |

| Capacitor separation and testing/screening | 414 |

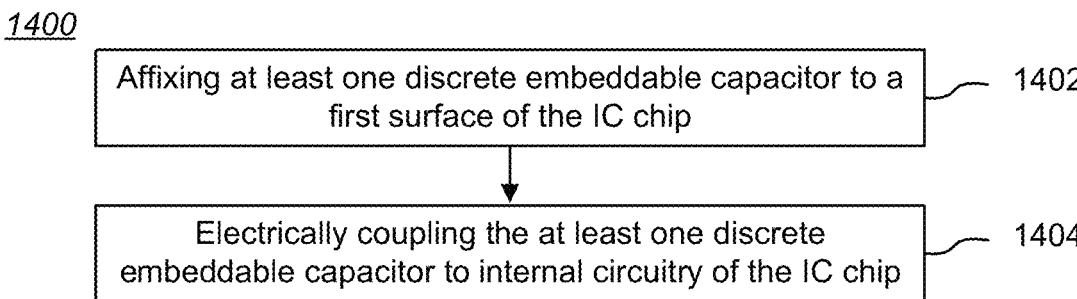

| | |
|---|---|
| Affixing at least one discrete embeddable capacitor to a first surface of the IC chip | 1402 |
| Electrically coupling the at least one discrete embeddable capacitor to internal circuitry of the IC chip | 1404 |

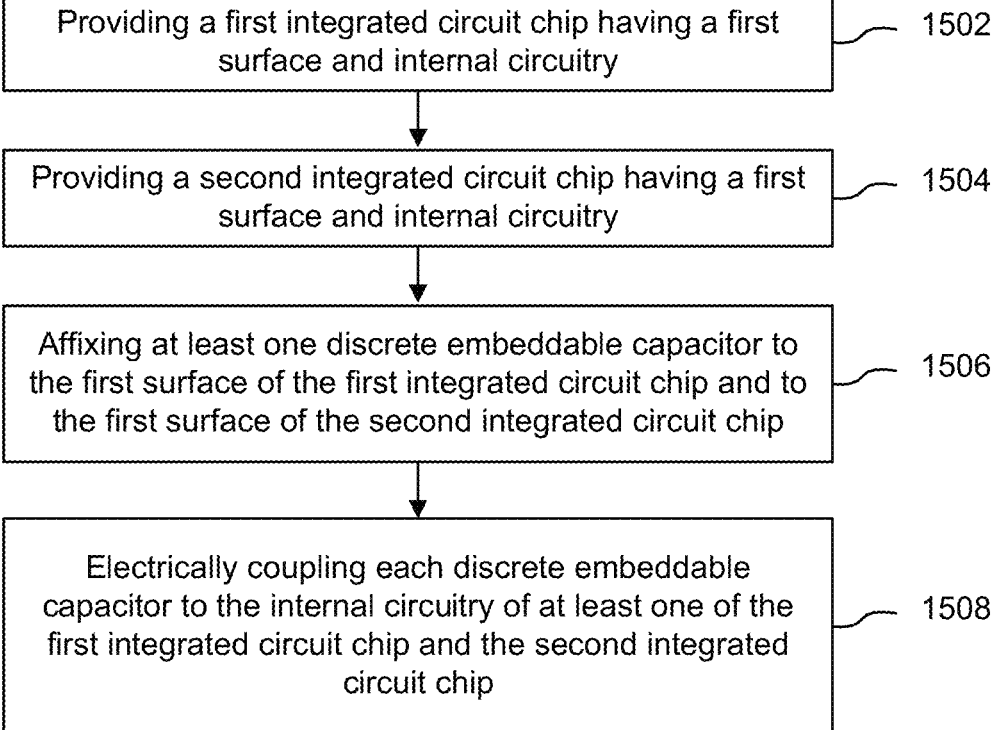

| | |
|---|---|
| Providing a first integrated circuit chip having a first surface and internal circuitry | 1502 |
| Providing a second integrated circuit chip having a first surface and internal circuitry | 1504 |
| Affixing at least one discrete embeddable capacitor to the first surface of the first integrated circuit chip and to the first surface of the second integrated circuit chip | 1506 |
| Electrically coupling each discrete embeddable capacitor to the internal circuitry of at least one of the first integrated circuit chip and the second integrated circuit chip | 1508 |

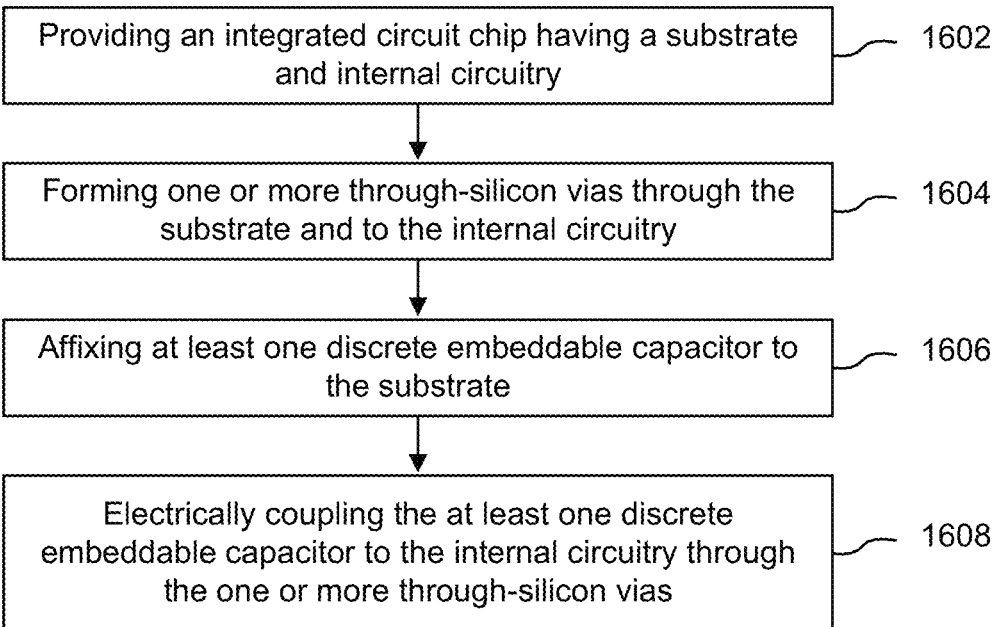

Providing an integrated circuit chip having a substrate and internal circuitry —— 1602

Forming one or more through-silicon vias through the substrate and to the internal circuitry —— 1604

Affixing at least one discrete embeddable capacitor to the substrate —— 1606

Electrically coupling the at least one discrete embeddable capacitor to the internal circuitry through the one or more through-silicon vias —— 1608

FIG. 16

INTEGRATION OF DISCRETE EMBEDDABLE CAPACITORS ON INTEGRATED CIRCUIT CHIPS

BACKGROUND

(1) Technical Field

The present invention relates to three-dimensional integrated circuit structures.

(2) Background

The electronics industry continues to strive for ever-increasing electronic functionality and performance in a wide variety of products, including (by way of example only) personal electronics (e.g., "smart" watches and fitness wearables), personal computers, tablet computers, wireless network components, televisions, cable system "set top" boxes, radar systems, and cellular telephones. A concurrent trend is the desire to package such increased functionality and/or performance into smaller sizes. The two-dimensional (2-D) planar form-factor or "footprint" of circuit modules and circuit boards is one constraint on reducing the size of electronic products.

Reducing the size of circuit modules and circuit boards is hampered by the need to accommodate passive components that are made by processes that are incompatible with fabrication of most transistor-based ICs. For example, capacitors are one of the most commonly used passive components in electronic packaging. For many applications, capacitors are used to reduce package electrical impedance, to enable a system to maintain a near-constant voltage across all operating frequencies, and as integral components of signal-handling circuitry (e.g., as part of filters, timing circuits, tuning circuits, impedance matching circuits, charge transfer circuits, etc.).

As of today, many capacitors are discrete components that directly mount on the surface of or within a module substrate or printed circuit board (PCB). For example, FIG. 1 is a stylized cross-sectional view of a prior art electronic system 100. In the illustrated example, an IC "chip" 102 is fabricated using a known fabrication process to make circuitry based on field effect transistors (FETs). Starting with a wafer substrate 104 (e.g., bulk silicon or high-resistivity silicon), an insulating buried oxide (BOX) layer 106 is formed, in and on which active FET regions 108 are formed (e.g., doped silicon with mask-formed channel, gate, source, drain, and isolation regions), in known fashion. The IC fabrication process up to this point is generally considered the frontend-of-line (FEOL) where individual transistor devices and other components (e.g., resistors) are patterned in or on the FET regions 108. The FEOL process steps generally cover everything up to (but not including) the deposition of metal interconnect layers.

After the last FEOL step, a wafer substrate 104 generally consists of isolated transistors without any interconnecting conductors. The back end of line (BEOL) is the second portion of IC fabrication where individual devices and other components are interconnected with conductors formed as part of or between one or more metal interconnect layers. As is known in the art, the BEOL includes fabrication of electrical vias, insulating layers (dielectrics), metal levels, contacts (pads), and bonding sites for chip-to-package connections.

Essentially, an IC chip 102 is formed in two parts, a "lower" FEOL base structure 109 and an "upper" BEOL superstructure 110 (the IC chip 102 in FIG. 1 is inverted). After FEOL and BEOL processing, the integrated structures undergo a number of additional known process steps, including dicing, testing, and packaging, to form the IC chip 102.

FIG. 1 shows the diced IC chip 102 inverted and electrically connected to a module substrate 112, such as by solder bumps 114. In the illustrated example, adjacent to the IC chip 102 is an external capacitor 116, which is also electrically connected to the module substrate 112. Conductors on and/or within the module substrate 112 couple the capacitor 116 to the IC chip 102. More than one capacitor 116 may be electrically connected through the module substrate 112 to the IC chip 102. The module substrate 112 in turn is often electrically connected to another structure, such as a PCB 118, which may host multiple module substrates 112 as well as other components. In some cases, IC chips 102 may be directly electrically connected to a PCB 118.

As should be apparent from FIG. 1, mounting capacitors 116 to a module substrate 112 consumes planar area, thus constraining reduction of the size of a module substrate 112 A variety of techniques exist for forming "on-chip" capacitors fully integrated with CMOS IC chips 102, including MIM (metal-insulator-metal), MOM (metal-oxide-metal), and MOS (metal-oxide-semiconductor) processes. However, radio frequency (RF) IC chips 102 intended for ever-smaller products and/or higher functionality (particularly as frequencies are pushed to bands above 5 GHz) require high capacitance densities that such on-chip capacitor techniques cannot achieve for IC dies of a few mm$^2$ in size at most. Current MIM, MOM, and MOS on-chip capacitor techniques deliver capacitance densities measured in pico-Farads per square millimeter (pF/mm$^2$). However, in many applications, capacitance densities need to be measured in micro-Farads per square millimeter (μF/mm$^2$)—that is, about 1,000,000 times greater than on-chip capacitors can provide.

Achieving high capacitance values using current on-chip capacitor techniques requires very large IC dies, which is the antithesis of modern design goals. Accordingly, circuit designs requiring high capacitance values typically use discrete capacitors, such as multi-layer ceramic capacitors (MLCCs), mounted near an IC chip 102 (as shown in FIG. 1), thereby consuming planar area of a mounting structure (e.g., module substrate 112 or PCB 118).

Accordingly, there exists a need in the art for a single-chip solution having much higher capacitance densities than are achievable with current on-chip solutions and which reduces consumption of planar area of a mounting structure. The present invention addresses this need.

SUMMARY

The present invention encompasses single-chip solutions and related methods that result in much higher capacitance densities than are achievable with current on-chip solutions and which reduce consumption of planar area of a mounting structure.

Embodiments of the present invention use vertical stacking to affix one or more discrete embeddable capacitors to an IC chip superstructure or base structure, and either sequentially or concurrently form electrical connections between the discrete embeddable capacitors and the IC chip. The inventive processes are compatible with CMOS fabrication temperatures (generally below about 300° C.) for the IC chip while allowing use of capacitors that are fabricated using other processes that may involve much higher temperatures (e.g., in excess of 1000° C.). The inventive processes allow connection of relatively large capacitances (e.g., ~0.5 µF-1 µF) to an IC chip without increasing the 2-D footprint of the IC chip. Some embodiments include reconfigurable discrete/ affixed embeddable capacitors and/or discrete/affixed embeddable capacitors with through-vias (distinct from capacitor electrode connections) for connecting circuitry.

One embodiment encompasses an integrated circuit chip having a first surface and internal circuitry, and including at least one discrete embeddable capacitor affixed to the first surface and electrically coupled to the internal circuitry.

Another embodiment encompasses an integrated circuit "sandwich" structure including a first integrated circuit chip having a first surface and internal circuitry, a second integrated circuit chip having a first surface and internal circuitry, and at least one discrete embeddable capacitor affixed to the first surface of the first integrated circuit chip and to the first surface of the second integrated circuit chip, each discrete embeddable capacitor being electrically coupled to the internal circuitry of at least one of the first integrated circuit chip and the second integrated circuit chip.

Yet another embodiment encompasses an integrated circuit chip having a substrate and internal circuitry, and including at least one discrete embeddable capacitor affixed to the substrate and electrically coupled to the internal circuitry through one or more through-silicon vias.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4 is a process flow chart showing one method for fabricating MLCCs of the types shown in FIGS. 2 and 3A-3D.

FIG. 14 is a process flow chart showing a method for affixing and electrically coupling a discrete embeddable capacitor to an integrated circuit chip.

FIG. 15 is a process flow chart showing a method for affixing and electrically coupling a discrete embeddable capacitor to two integrated circuit chips.

FIG. 16 is a process flow chart showing a method for making an integrated circuit chip structure.

Like reference numbers and designations in the various drawings indicate like elements.

DETAILED DESCRIPTION

The present invention encompasses single-chip solutions and related methods that result in much higher capacitance densities than are achievable with current on-chip solutions and which reduce consumption of planar area of a mounting structure.

Embodiments of the present invention use vertical stacking to affix one or more discrete embeddable capacitors to an IC chip superstructure or base structure, and either sequentially or concurrently form electrical connections between the discrete embeddable capacitors and the IC chip. The inventive processes allow connection of relatively large capacitances (e.g., ~0.5 µF-1 µF) to an IC chip without increasing the 2-D footprint of the IC chip. Some embodiments include reconfigurable discrete/affixed embeddable capacitors and/or discrete/affixed embeddable capacitors with through-vias (distinct from capacitor electrode connections) for connecting circuitry. The inventive processes are compatible with CMOS fabrication temperatures (generally below about 300° C.) for the IC chip while allowing use of capacitors that are fabricated using other processes that may involve much higher temperatures (e.g., in excess of 1000° C.).

Capacitor Structure and Fabrication Examples

It may be useful to review the structure and example fabrication techniques for making discrete embeddable capacitors suitable for use with embodiments of the present invention.

Figure 1:
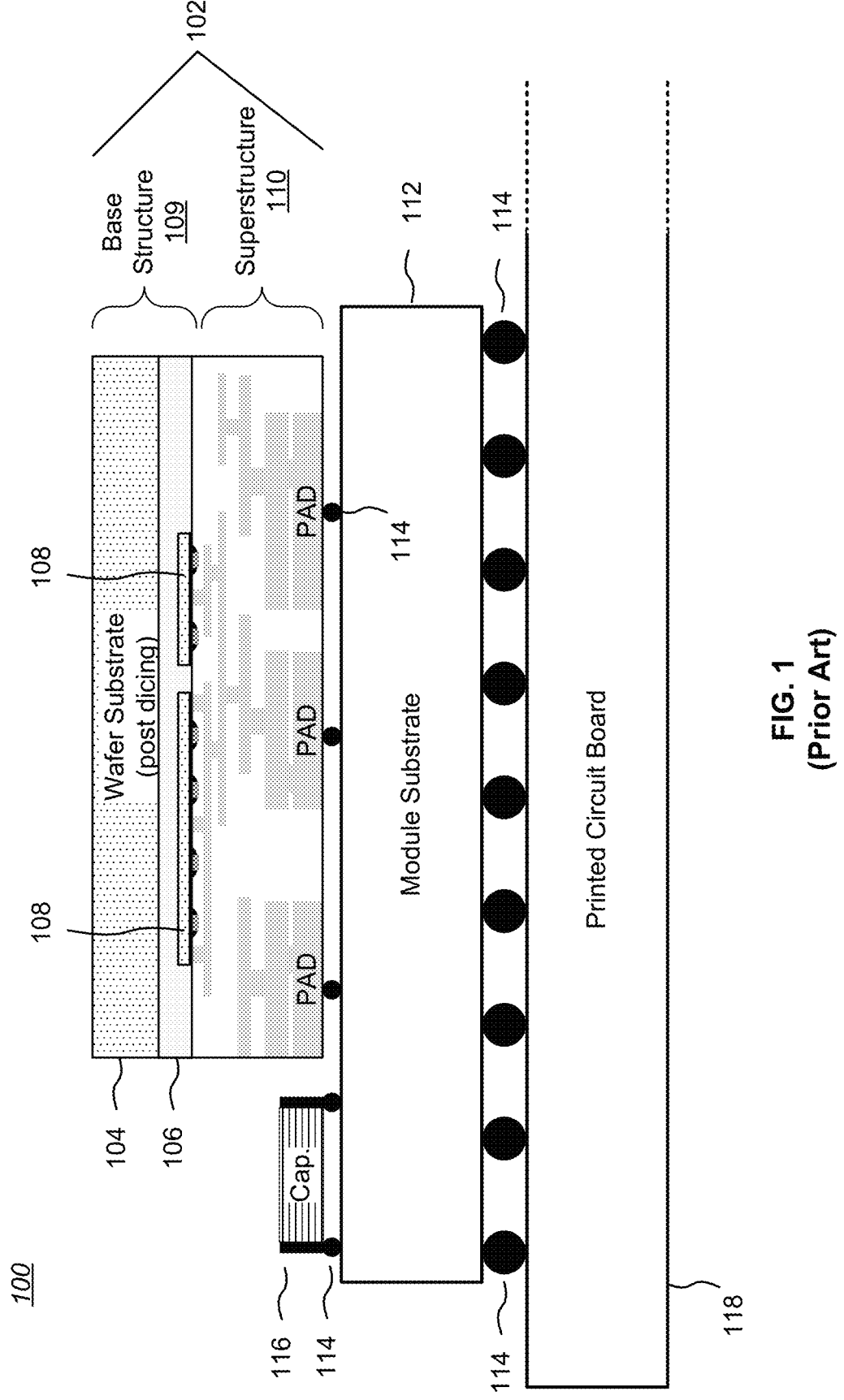
FIG. 1 is a stylized cross-sectional view of a prior art electronic system.
Figure 2:
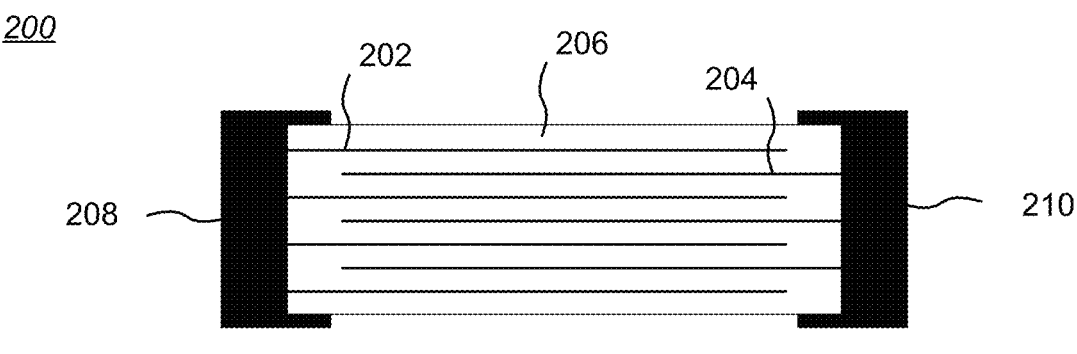
FIG. 2 is a stylized cross-sectional view of a multi-layer ceramic capacitor (MLCC) 200.

FIG. 2 is a stylized cross-sectional view of a multi-layer ceramic capacitor (MLCC) 200. The illustrated MLCC example is of a type available, for example, from Murata Manufacturing Co., Ltd. (GRM series). The body of the capacitor 200 includes interdigitated electrically-isolated conductive plates (also known as internal electrodes) 202, 204 separated by a ceramic dielectric 206. External termination (end-cap) main electrodes 208, 210 connect to respective sets of the internal electrodes 202, 204 and allow for connection to a module substrate or PCB. Such MLCCs are commercially available as small as about 0.25 mm L×0.125 mm W with capacitances of up to about 0.1 μF. Somewhat larger MLCCs (1.0 mm L×0.5 mm W) are available with capacitances of up to about 22 μF. It should be noted that embodiments of the invention are not limited to these parameter values.

Figure 3A:
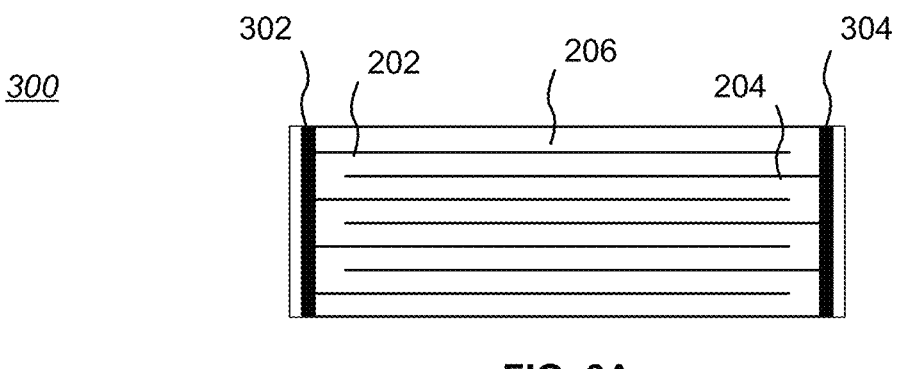
FIG. 3A is a stylized cross-sectional view of a first novel MLCC.

FIG. 3A is a stylized cross-sectional view of a first novel MLCC 300. The body of the MLCC capacitor 300 includes interdigitated electrically-isolated internal electrodes 202, 204 separated by a ceramic dielectric 206. Internal via-type main electrodes 302, 304 (rather than external end-cap main electrodes) connect to respective sets of the internal electrodes 202, 204 and allow for connection to a module substrate or PCB. An advantage of the internal main electrodes 302, 304 is that they are protected from possible unintended electrical contacts to the sides of the capacitor 300.

Figure 3B:
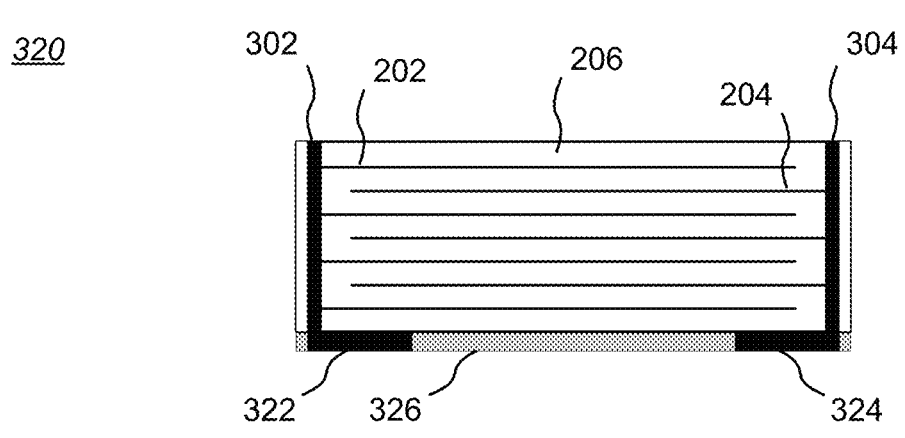
FIG. 3B is a stylized cross-sectional view of a second novel MLCC.

FIG. 3B is a stylized cross-sectional view of a second novel MLCC 320. While similar in most respects to the capacitor 300 of FIG. 3A, each of the internal via-type main electrodes 302, 304 is coupled on at least one surface (a "bonding surface") of the MLCC 320 to a corresponding bonding pad 322, 324 suitable for forming hybrid bonds (discussed below). An insulating fill material 326 may be fabricated to facilitate planarization of the bonding surface. Techniques for forming the bonding pads 322, 324 and fill material 326 are well-known in the art.

Figure 3C:
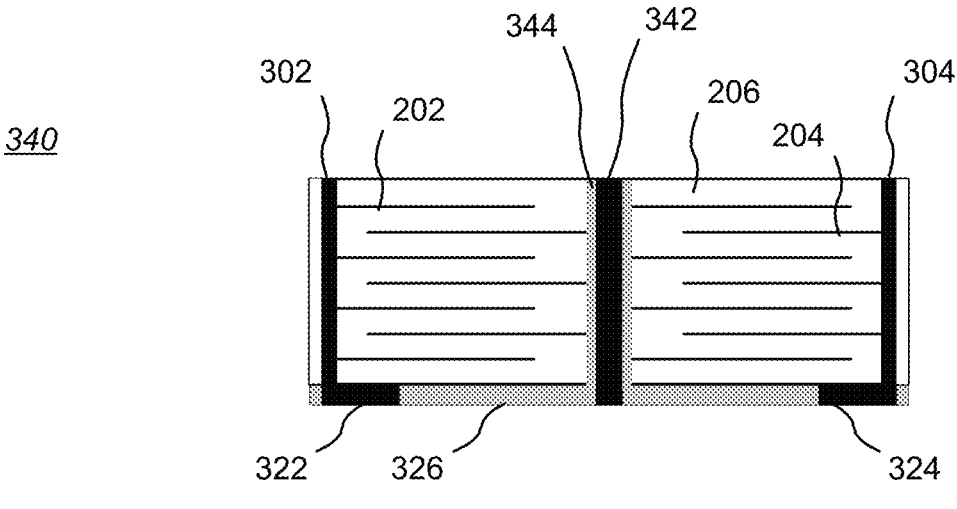
FIG. 3C is a stylized cross-sectional view of a third novel MLCC.

FIG. 3C is a stylized cross-sectional view of a third novel MLCC 340. While similar in most respects to the capacitor 320 of FIG. 3B, one or more through-vias 342 may be formed that penetrate the entire height (with respect to the page) of the MLCC 340 through a region of insulation 344 so as to be isolated from the internal or external electrodes of the MLCC 340. Techniques for forming a through-via 342 are well-known in the art. Such through-vias 342 enable electrical connection from above the top of the MLCC 340 to circuitry underneath the bottom of the MLCC 340 without electrically connecting the electrodes (internal or external) of the MLCC 340. For example, this capability may be useful when circuitry underneath the bottom of the MLCC 340 must be connected to a solder bump or the like in order to couple to a mounting structure such as a module substrate or PCB, and no shorter connection path is available or feasible. One or more through-vias 342 may be situated within a unitary (non-partitioned) capacitor or within a partitioned capacitor (see below regarding capacitor partitioning). In some embodiments, a through-via 342 may be electrically coupled to one or more capacitor partitions to serve as a common main electrode. Through-vias also may be used in conjunction with capacitors having external termination (end-cap) main electrodes, such as the example shown in FIG. 2. Another advantage of through-vias 342 includes allowing the MLCC 340 to be much closer to the circuitry underneath the bottom of the MLCC 340, thereby reducing parasitic effects of interconnection, which is particularly important at high frequencies. A further advantage of through-vias 342 is a reduction in IC planar area or "real estate", allowing a reduction in overall footprint compared to a two-part solution using an IC spaced apart from a capacitor.

Figure 3D:
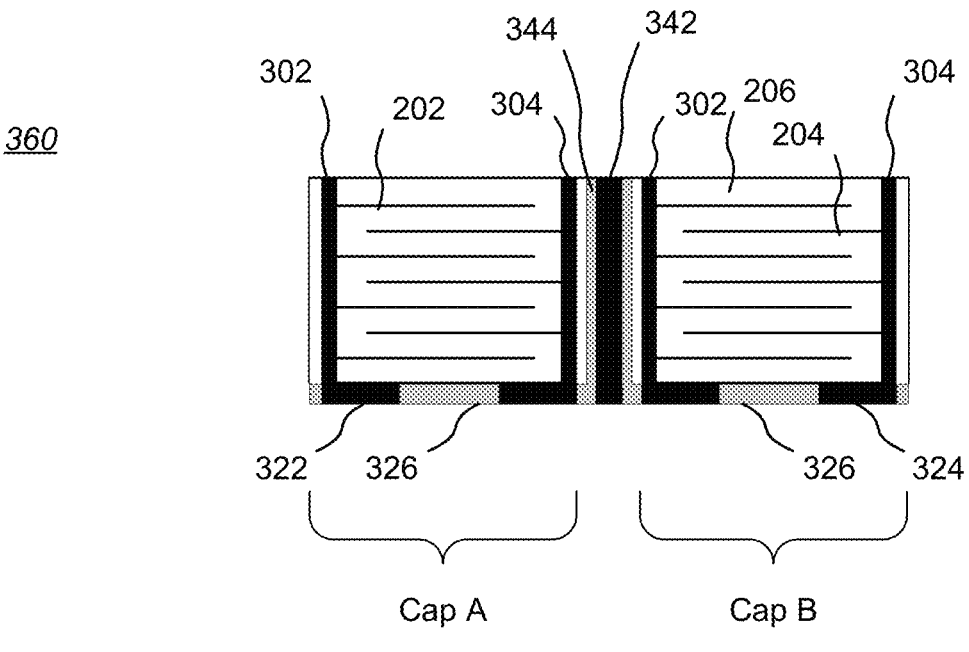
FIG. 3D is a stylized cross-sectional view of a fourth novel MLCC.

FIG. 3D is a stylized cross-sectional view of a fourth novel MLCC 360. While similar in most respects to the capacitor 340 of FIG. 3C, the MLCC 360 is shown as having two capacitor partitions, Cap A and Cap B, which, in the illustrated example, happen to be separated by a through-via 342 (thus, some embodiments of the partitioned MLCC 360 may not include through-vias 342). The through-vias 342 do not necessarily partition an MLCC 360. Thus a partitioned MLCC 360 may be partitioned by one or more through-vias 342 or may be partitioned and include one or more through-vias 342. As described below, partitioning a discrete embeddable capacitor structure into an array of two or more capacitor sub-elements or cells, each with corresponding internal or external electrodes, enables reconfigurable discrete/affixed embeddable capacitors.

Figure 3E:
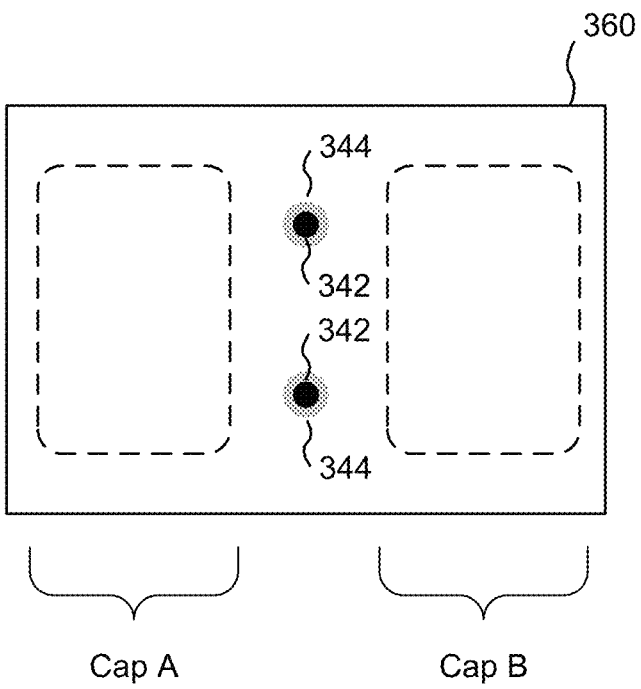
FIG. 3E is a stylized plan view of the fourth novel MLCC.

FIG. 3E is a stylized plan view of the fourth novel MLCC 360. The subsurface layers comprising two capacitor partitions, Cap A and Cap B, are shown in dashed outline. Two through-vias 342 are shown, each surrounded by a region of insulation 344. Embodiments may use fewer or more through-vias 342. Note that the through-vias 342 are not necessarily to scale with respect to the capacitor partitions.

FIG. 4 is a process flow chart 400 showing one method for fabricating MLCCs of the types shown in FIGS. 2 and 3A-3D. In general, embeddable discrete embeddable capacitor component fabrication may be based on a combination of multi-layer ceramic capacitor (MLCC) and low temperature-co-firing-ceramic (LTCC) technology. In the illustrated example, pre-milled ceramic dielectric powder is mixed with a suitable amount of binder (typically an organic polymer) to make a dielectric "green" sheet [Block 402]. The ceramic powder may be, for example, barium titanate ($BaTiO_3$). Internal electrodes are formed by printing (e.g., screen printing) a conductive paste (e.g., nickel) on the green sheet to form multiple sets of parallel capacitor plates [Block 404]. At a later stage, the sets of parallel capacitor plates will be separated (diced) to form individual discrete embeddable capacitors.

Multiple printed green sheets are stacked together and pressed (laminated) [Block 406]. The number of stack layers and the total layer thickness are pre-determined to achieve a target capacitance value. Through-vias may be formed and then filled with a suitable conductor, such as a metal like copper or aluminum [Block 408]. Through-vias may be formed using a number of techniques, including laser drilling through the laminated stack. In alternative processes, through-vias may be formed before capacitor plate printing and stacking by punching holes through the green sheet and filling the holes with a conductor.

As noted above, a single discrete embeddable capacitor structure may be internally divided into an array of two or more capacitor cells or partitions, with the partitions being electrically isolated from each other.

Surface termination electrodes or pads may be printed to connect to the through-vias [Block 410], and then the multi-layered laminated green sheet may be loaded into a furnace for binder burnout and sintering [Block 412]. The sintering temperature of $BaTiO_3$, prepared by a conventional mixed-oxide method, is in general considerably above 1200° C. to obtain dense ceramic bodies. Sintering temperatures of about 1100° C. are possible using nano-sized $BaTiO_3$ and a two-step sintering procedure. However, such temperatures are well above common IC fabrication temperatures, particularly for CMOS ICs (generally below about 300° C.).

In some processes, additional printing of conductors may be done. The individual capacitors may then be separated from each other, and electrically tested and screened for capacitance, dissipation factor, and intrinsic resistance values [Block 414]. In some processes, testing may occur before singulation.

As should be apparent, MLCC fabrication by means of stacking and laminating layers concurrently differs from semiconductor device fabrication, where layers are generally processed serially, with each new layer fabricated on previous layers.

Of note, embodiments of the present invention are not limited to use of MLCC capacitors, but include other known capacitor structures, including (but not limited to), ceramic capacitors, tantalum capacitors, aluminum electrolytic capacitors, and conductive polymer capacitors.

Capacitor Placement and Sequential Electrical Coupling

Figure 5:
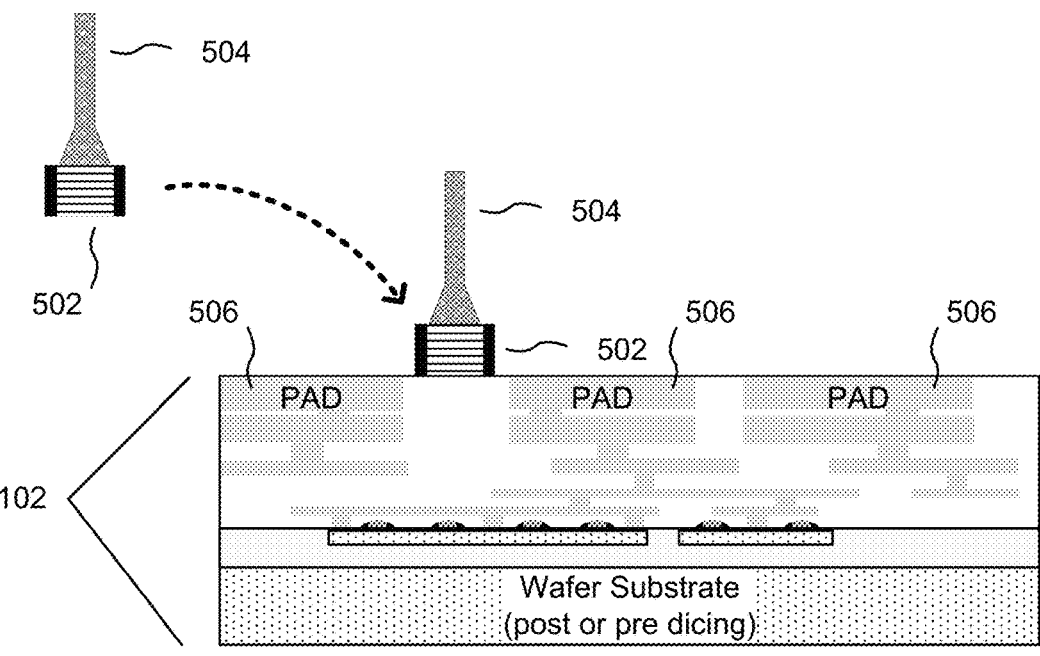
FIG. 5 is a stylized cross-sectional view of a "pick and place" capacitor placement embodiment.

FIG. 5 is a stylized cross-sectional view of a "pick and place" capacitor placement embodiment. In the illustrated example, a discrete embeddable capacitor 502 is picked (for example, from a tape holding a multiplicity of tested "known-good" capacitors 502) using a "pick and place" apparatus 504. The "pick and place" apparatus 504 then places the capacitor 502 onto a surface of an IC chip 102. Bonding of the capacitor 502 to the IC chip 102 surface may be achieved in a number of ways, including by using an adhesive polymer or by adhesion between the adjoining surfaces that occurs as a result of chemical bonds established between molecules from the two surfaces. In the illustrated example, the capacitor 502 is placed and affixed to the IC chip 102 between pads 506 but not electrically connected as yet (see description of FIG. 7 below). The capacitor 502 may be, for example, any of the types shown in FIGS. 2 and 3A-3D.

The "pick and place" apparatus 504 may be configured to pick and place more than one capacitor 502 at a time to increase manufacturing throughput. The IC chip 102 may be in a pre-dicing configuration (i.e., still integrated with a wafer substrate bearing multiple IC chips 102), in which case the "pick and place" method is a form of die-to-wafer bonding. Alternatively, the IC chip 102 may be in a post-dicing configuration (i.e., singulated from a wafer substrate), in which case the "pick and place" method is a form of die-to-die bonding.

Figure 6A:
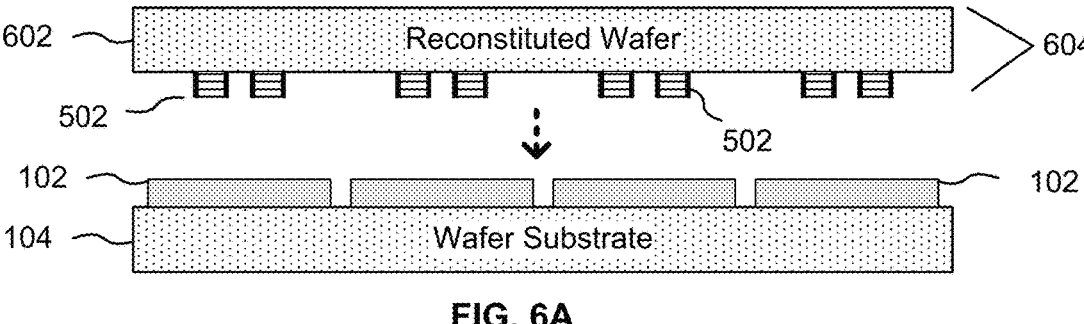
FIG. 6A is a stylized cross-sectional view of a wafer-to-wafer capacitor placement embodiment.

FIG. 6A is a stylized cross-sectional view of a wafer-to-wafer capacitor placement embodiment. In the illustrated example, multiple capacitors 502 are mounted on a carrier wafer 602. For example, the carrier wafer 602 (e.g., glass or silicon) may have an adhesive layer (e.g., an epoxy compound or adhesive polymer) applied and then be populated with multiple known-good capacitors 502 using, for example, a "pick and place" apparatus to fabricate a "reconstituted" wafer 604. A wafer-to-wafer bonding process is then applied in which the reconstituted wafer 604 is aligned with and contacted to a wafer substrate 104 bearing multiple pre-dicing ICs 102 (shown with dicing "streets" between individual ICs 102). The wafer-to-wafer bonding process places and affixes the capacitors 502 on corresponding pre-dicing ICs 102.

Figure 6B:
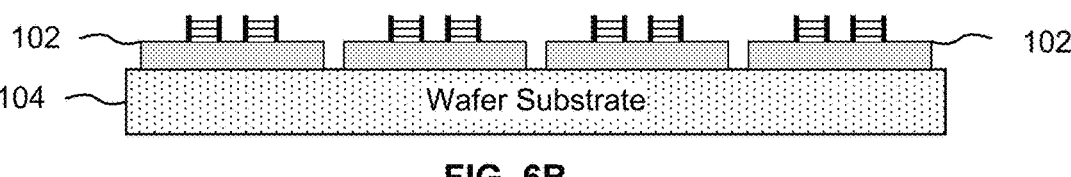
FIG. 6B is a stylized cross-sectional view of the wafer-to-wafer capacitor placement embodiment of FIG. 6A after the bonding process has completed.

FIG. 6B is a stylized cross-sectional view of the wafer-to-wafer capacitor placement embodiment of FIG. 6A after the bonding process has completed. In the illustrated example, the carrier wafer 602 has been removed (for example, by sliding it off or by laser debonding). In the illustrated example, multiple capacitors 502 have been placed and affixed (but not yet electrically connected) to respective IC chips 102.

Figure 7:
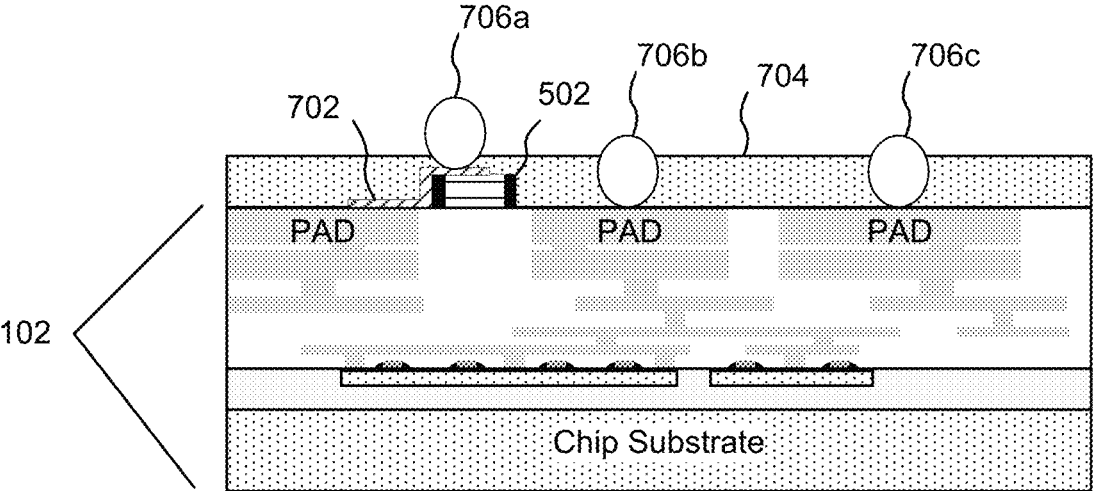
FIG. 7 is a stylized cross-sectional view of an IC chip which has undergone additional processing to form electrical connections to a capacitor after affixation using one of the methods shown in FIGS. 5 and 6A-6B.

As noted, the processes of FIGS. 5 and 6A-6B result in affixation of one or more capacitors 502 to an IC chip 102 but not electrical connection. FIG. 7 is a stylized cross-sectional view of an IC chip 102 which has undergone additional sequential processing to form electrical connections to a capacitor 502 after affixation using one of the methods shown in FIGS. 5 and 6A-6B.

Some BEOL fabrication processes allow application of a redistribution layer (RDL), which is generally an extra patterned conductive layer (commonly aluminum) on an IC die that makes the input/output (I/O) pads of an IC die available to be coupled to other locations of the die, and/or to another IC die, and/or to specialized packaging structures. The RDL may be formed on top of the "upper" BEOL superstructure 110 of an IC chip 102. In some cases (for example, for single-layer transfer chip structures), the RDL may be formed adjacent to the primary circuit layer containing the active FET regions 108 after removal of the wafer substrate 104 and re-attachment of the primary circuit layer and superstructure to a handle wafer.

Referring to FIG. 7, a first RDL contact 702 is shown electrically formed between and electrically coupling a first main electrode of a capacitor 502 and a pad of an IC chip 102 to which the capacitor 502 is affixed. A second RDL contact (not shown) may be formed to electrically couple a second main electrode of the capacitor 502 to another pad of the IC chip 102 (the second RDL contact may be formed in the Z-direction of the IC chip 102 structure, into the figure page). An insulating fill material 704 may be added as a protective layer.

FIG. 7 also shows solder bumps 706a-706c formed in electrical contact with the first RDL contact 702 and two of the illustrated pads of the IC chip 102. In some embodiments, the solder bump 706a for the first RDL contact 702 may be omitted. If the solder bump 706a for the first RDL contact 702 is used, some care should be taken in setting the height of the capacitor 502 so that any unevenness of the solder bumps 706a-706c can be accommodated during solder reflow (the solder bumps having some degree of plasticity and small height differences simply result in more or less sideways spreading of the solder bumps).

Concurrent Capacitor Placement & Electrical Coupling—Hybrid Bonding

Figure 8A:
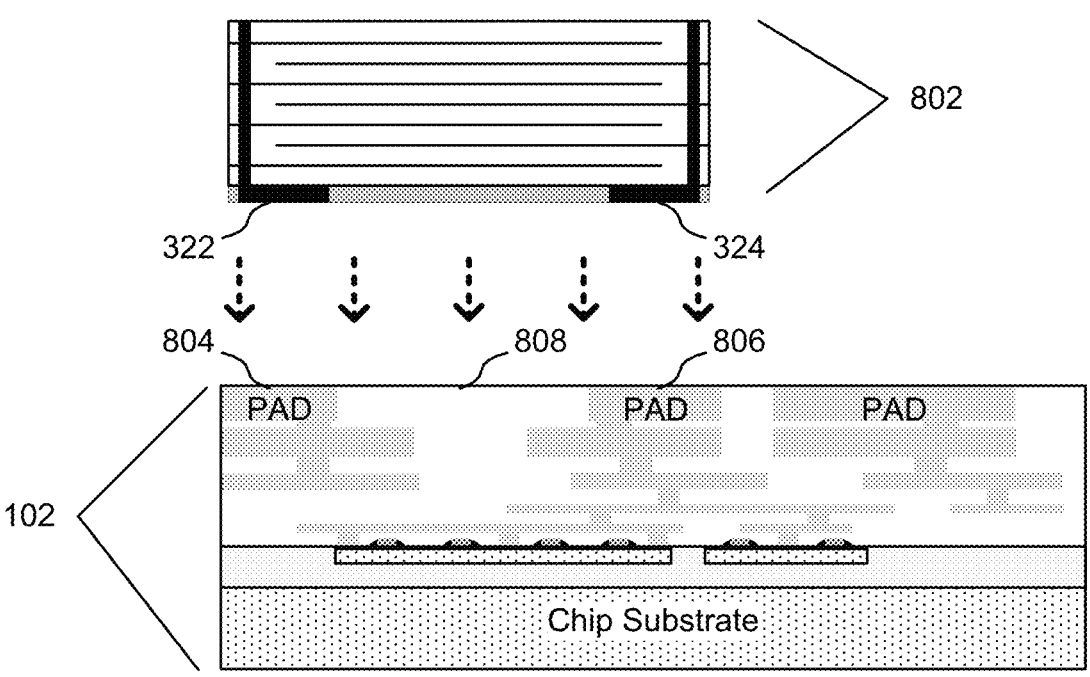
FIG. 8A is a stylized cross-sectional view of a first capacitor placement embodiment having concurrent electrical connection.

FIG. 8A is a stylized cross-sectional view of a first capacitor placement embodiment having concurrent electrical connection. In the illustrated example, a capacitor 802 having bonding pads 322, 324 (for example, any of the capacitor types shown in FIGS. 3B-3D) is concurrently placed on and electrically coupled to respective bonding pads 804, 806 and associated dielectric 808 an IC chip 102 using hybrid bonding. The capacitor 802 may be placed using die-to-die, die-to-wafer, or wafer-to-wafer (for example, using a reconstituted wafer having multiple capacitors 502).

Hybrid bonding of the wafers/dies generally results from molecular bonding between both dielectric materials (e.g., silicon dioxide, SiCN, SiCOH, and/or analogous alloys) and conductive interconnect materials (e.g., copper, aluminum, and/or their alloys) when placed in a mating engagement. Hybrid bonding technology has a demonstrated high interconnect density, is a planar technology that does not require underfill or carrier wafer integration, and enables formation of interconnects during a bond annealing stage at relatively low temperatures (e.g., ≤~450° C.).

Figure 8B:
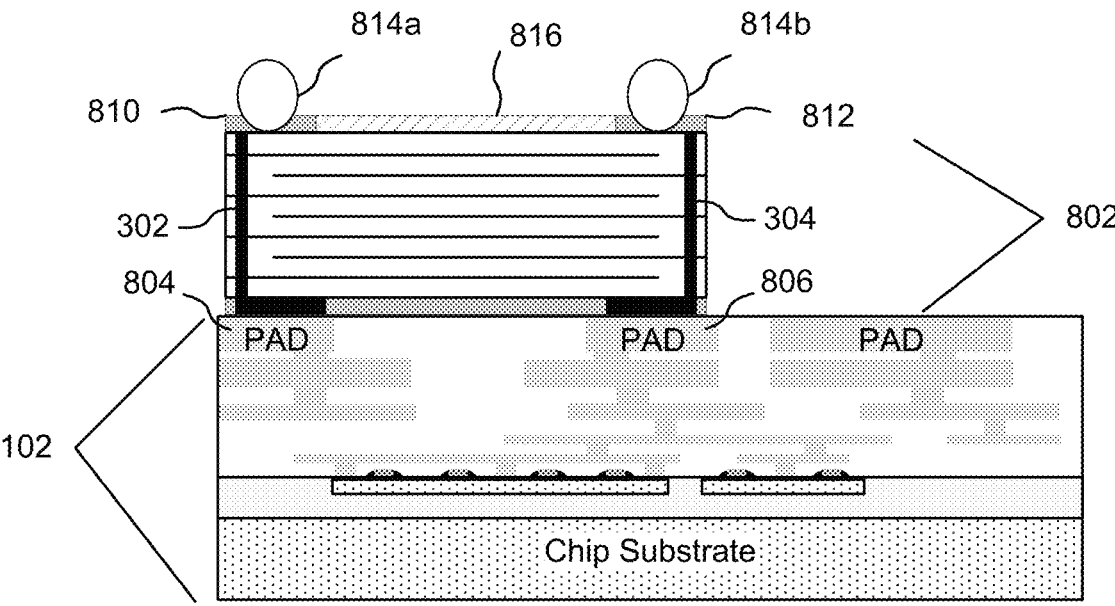
FIG. 8B is a post-bonding stylized cross-sectional view of the first capacitor placement embodiment having concurrent electrical connection.

FIG. 8B is a post-bonding stylized cross-sectional view of the first capacitor placement embodiment having concurrent electrical connection. In the illustrated example, conductive contacts 810, 812 have been formed to electrically couple to the internal via-type main electrodes 302, 304, and solder bumps 814a, 814b have been formed to electrically couple to the conductive contacts 810, 812, respectively. An insulating fill material 816 may be added as a protective layer.

Figure 8C:
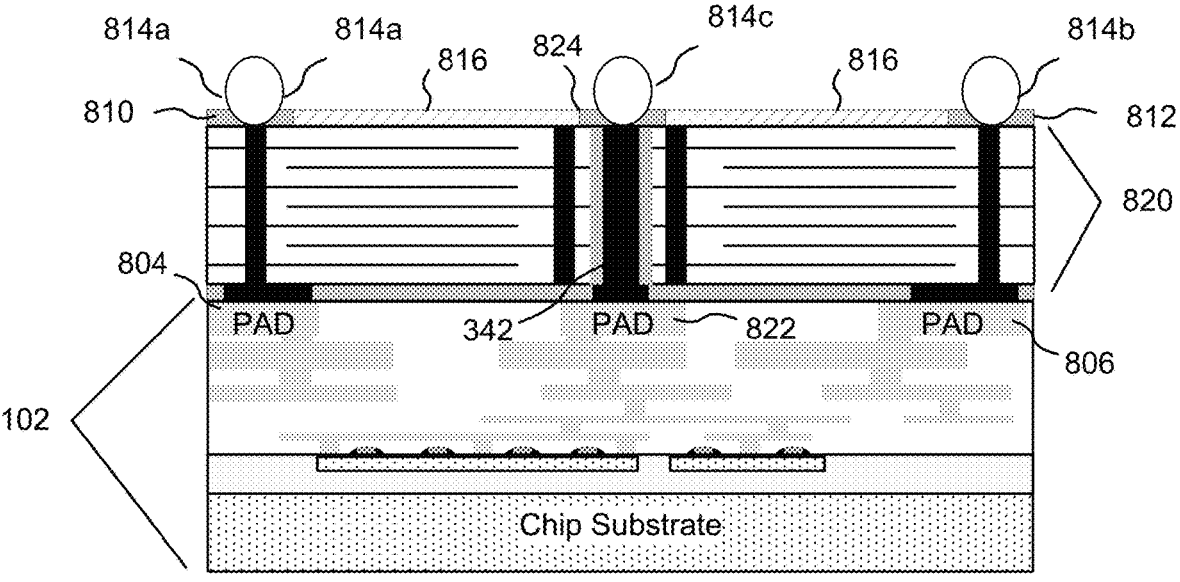
FIG. 8C is a post-bonding stylized cross-sectional view of a variant of the first capacitor placement embodiment having concurrent electrical connection.

FIG. 8C is a post-bonding stylized cross-sectional view of a variant of the first capacitor placement embodiment having concurrent electrical connection. While similar in most aspects to the embodiment of FIG. 8B, the capacitor 802 of FIG. 8B has been replaced with a capacitor 820 of the type shown in FIG. 3C having at least one through-via 342. In the illustrated example, a through-via 342 has been hybrid bonded to a pad 824 of the IC chip 102. In addition, an added conductive contact 824 has been formed to electrically couple to the through-via 342, and a solder bump 814*c* has been formed to electrically couple to the conductive contact 824. The illustrated arrangement allows electrical connections to be made to portions of the IC chip 102 that underlie the capacitor 820 without electrically connecting to any of the electrodes of the capacitor 820. While hybrid bonding is used in the example of FIG. 8C, thermo-compression bonding (discussed in the next section) may be used as an alternative bonding technique.

Figure 9A:
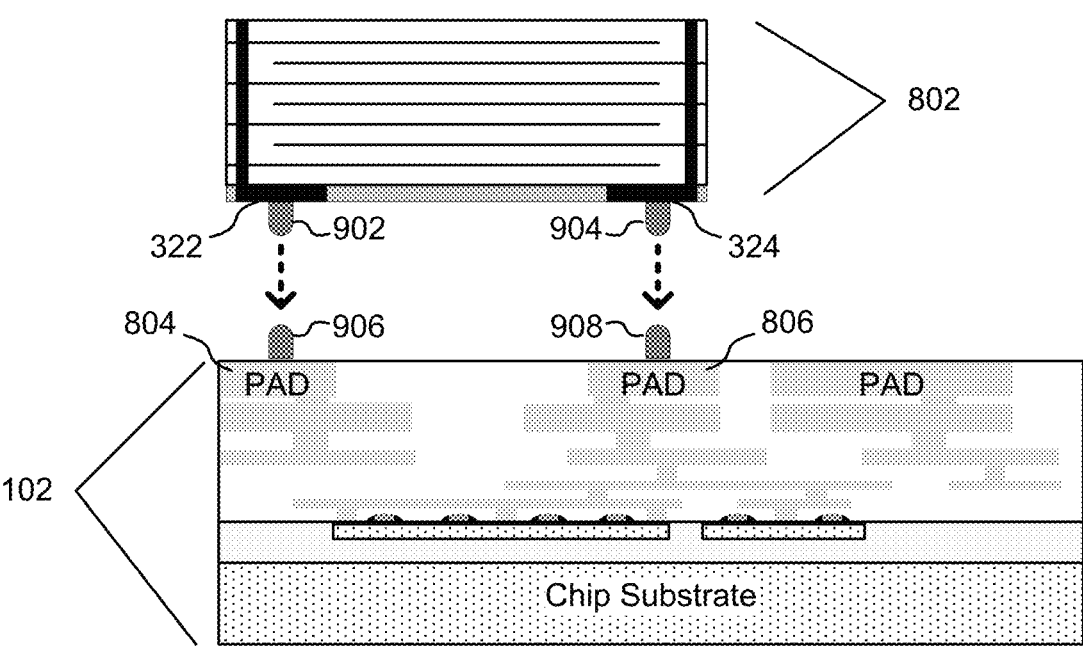
FIG. 9A is a stylized cross-sectional view of a second capacitor placement embodiment having concurrent electrical connection.

Concurrent Capacitor Placement & Electrical Coupling— Thermo-Compression Bonding FIG. 9A is a stylized cross-sectional view of a second capacitor placement embodiment having concurrent electrical connection. In the illustrated example, a capacitor 802 with bonding pads 322, 324 (for example, any of the capacitor types shown in FIGS. 3B-3D) to which are affixed pillar bumps 902, 904. In addition, the IC chip 102 also includes corresponding pillar bumps 906, 908 formed on corresponding bonding pads 804, 806. Pillar bumps may be made of copper with a contact end coated in nickel and then silver or tin. Pillar bumps allow a finer pitch compared to solder bumps (typically at least twice as fine), which allows more connections between components within a specified 2-D planar footprint.

The pillar bumps 902, 904 of the capacitor 802 are concurrently placed on and electrically coupled to the corresponding pillar bumps 906, 908 of the IC chip 102 using thermo-compression bonding. Thermo-compression bonding is also referred to as diffusion bonding, pressure joining, thermocompression welding, or solid-state welding. Two metals (e.g., silver or tin) on interfaces of components to be physically connected and electrically coupled are brought into contact while applying force and heat simultaneously. Atoms migrate between the metallic crystal lattices of the two components based on crystal lattice vibration, which adheres the interfaces together. This method enables direct electrical interconnection between two structures without additional steps.

The capacitor 802 may be placed using die-to-die, die-to-wafer, or wafer-to-wafer (for example, using a reconstituted wafer having multiple capacitors 502). In some embodiments, the gap 910 between the capacitor 802 and the IC chip 102 may be filled with a suitable insulating/protective material before or after thermo-compression bonding takes place.

Figure 9B:
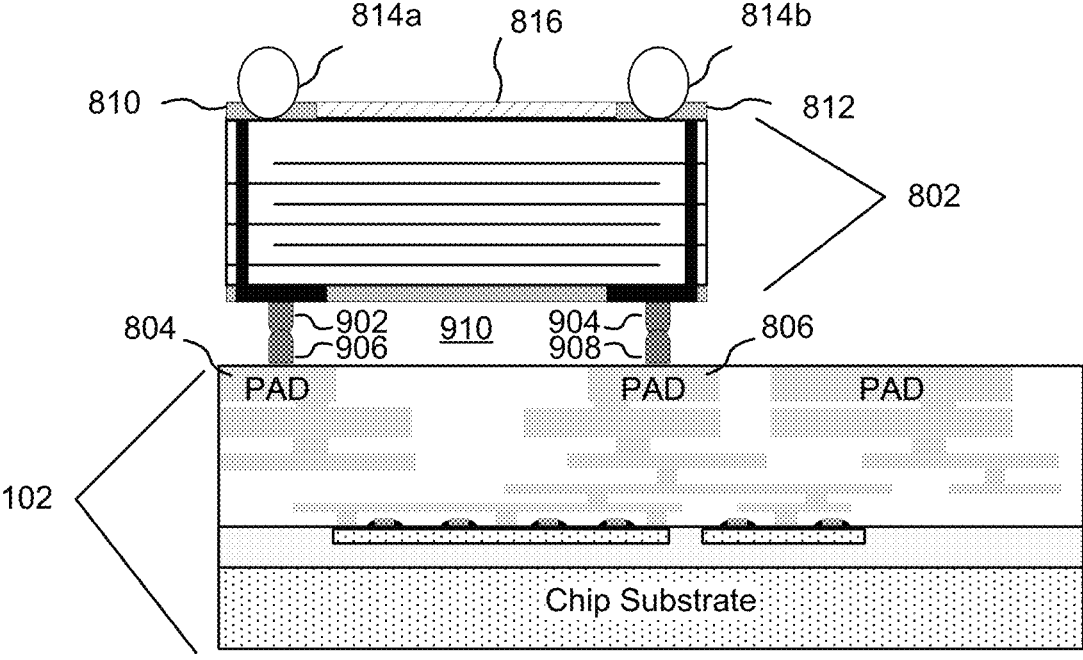
FIG. 9B is post-bonding stylized cross-sectional view of the second capacitor placement embodiment having concurrent electrical connection.

FIG. 9B is post-bonding stylized cross-sectional view of the second capacitor placement embodiment having concurrent electrical connection. In the illustrated example, conductive contacts 810, 812 have been formed to electrically couple to the internal via-type main electrodes 302, 304, and solder bumps 814*a*, 814*b* have been formed to electrically couple to the conductive contacts 810, 812, respectively. An insulating fill material 816 may be added as a protective layer.

As should be clear, the capacitor 802 may be replaced by other capacitor types, including (without limitation) a capacitor having a through-via 342.

Shared Capacitor Embodiment

Figure 10:
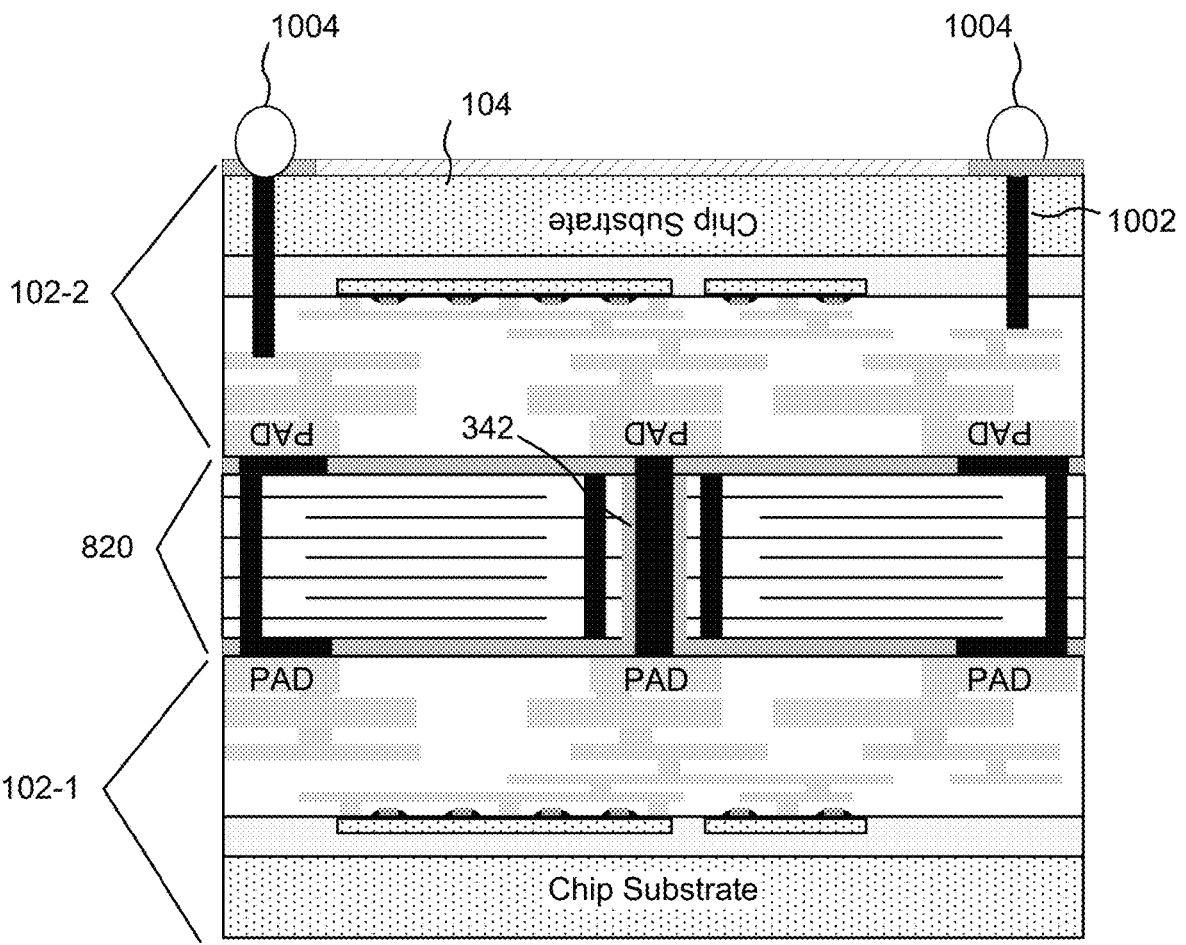
FIG. 10 is a stylized cross-sectional view of a shared capacitor placement embodiment.

In some embodiments, the capacitor or capacitors affixed to one IC chip 102 may be shared with a second IC chip. For example, FIG. 10 is a stylized cross-sectional view of a shared capacitor placement embodiment. Initially, a capacitor 820 (in this example, having a through-via 342) is affixed to a first IC chip 102-1, such as by hybrid bonding or pillar bump bonding. Then a second IC chip 102-2 is inverted and affixed to the exposed surface of the capacitor 820, such as by hybrid bonding or pillar bump bonding, thereby forming a "sandwich" structure. Through-silicon vias (TSVs) 1002 are formed through the substrate 104 of at least one of the IC chips 102-1, 102-2, and solder bumps 1004 may be connected to the TSVs 1002; in the illustrated example, the TSVs 1002 are formed through the inverted "top" IC chip 102-2. The TSVs 1002 may be formed before or after bonding to the capacitor 820. In some embodiments, the substrate 104 of at least one of the IC chips 102-1, 102-2 may be thinned or entirely removed.

While FIG. 10 shows the capacitor 820 as being electrically coupled to the internal circuitry of both of the IC chips 102-1, 102-2, in some embodiments, the capacitor 820 may be electrically coupled to the internal circuitry of only one of the IC chips 102-1, 102-2. One or more through-vias 342 may be used to electrically couple the internal circuitry of the IC chips 102-1, 102-2 without both IC chips 102-1, 102-2 sharing the capacitor 820. If the capacitor 820 is partitioned, then some capacitor cells may be electrically coupled only to IC chip 102-1 while other capacitor cells may be electrically coupled only to IC chip 102-2.

While FIG. 10 shows the use of hybrid bonding to affix the IC chips 102-1, 102-2 and the capacitor 820, other affixation and electrical coupling methods may be used in some applications.

Reconfigurable Partitioned Capacitor Embodiment

Figure 11A:
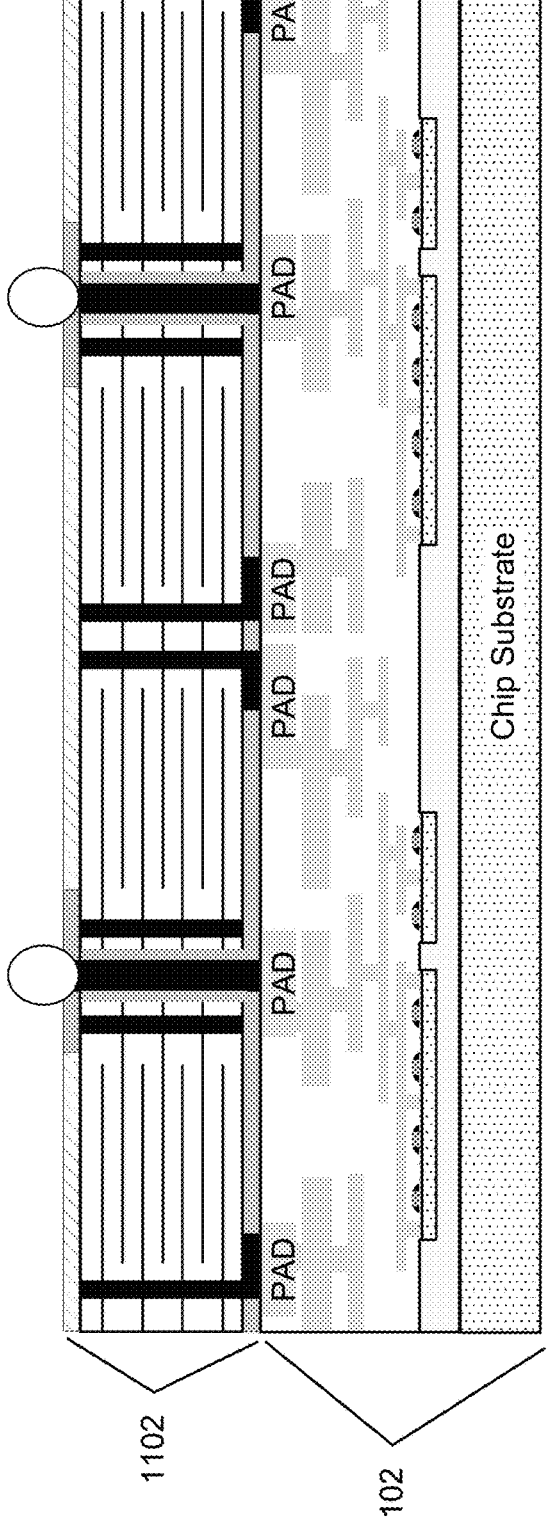
FIG. 11A is a stylized cross-sectional view of a partitioned capacitor embodiment.
Figure 11B:
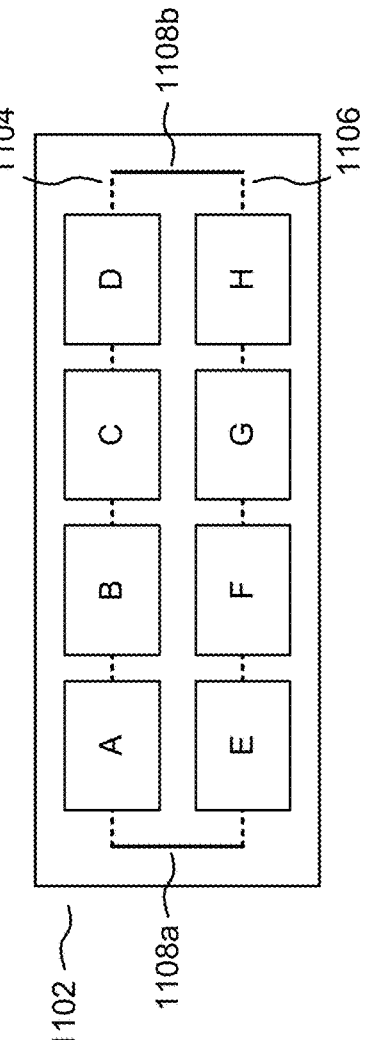
FIG. 11B is a stylized plan view of the partitioned capacitor embodiment of FIG. 11A.

As mentioned above, in some embodiments, a capacitor may have multiple partitions with each partition having some known capacitance. For example, FIG. 11A is a stylized cross-sectional view of a partitioned capacitor embodiment, and FIG. 11B is a stylized plan view of the partitioned capacitor embodiment of FIG. 11A. In the illustrated example, a capacitor 1102 affixed to an IC chip 102 is partitioned into a 4×2 array of capacitor cells A-H. Connected FET switches or fuses within the active layer of an IC chip 102 (or within other active circuitry that may be included with the affixed capacitor 1102) may combine the capacitor cells A-H in series or parallel as desired to achieve a desired capacitance.

As one example, capacitor cells A-D may be connected by such switches or fuses in a first series (as indicated by dotted line 1104) to achieve a first capacitance, while capacitor cells E-H may be connected by such switches or fuses in a second series (as indicated by dotted line 1106) to achieve a second capacitance. As another example, the first series of connected capacitor cells A-D and the second series of connected capacitor cells E-H may be further connected in parallel (as indicated by solid lines 1108*a*, 1108*b*). The main electrodes of any two capacitor cells may be coupled in series through one intermediate switch. The main electrodes of any two capacitor cells may be coupled in parallel by means of two intermediate switches, each connecting a main electrode of one capacitor cell to a corresponding main electrode of the other capacitor cell.

If the capacitor cells in a partitioned capacitor 1102 are connectable by transistor switches, then the capacitor 1102 may be operated as a digitally tunable capacitor (DTC) that may have its capacitance value dynamically selected and changed, including during field operation of the IC chip 102.

Backside Capacitor Embodiment

Figure 12:
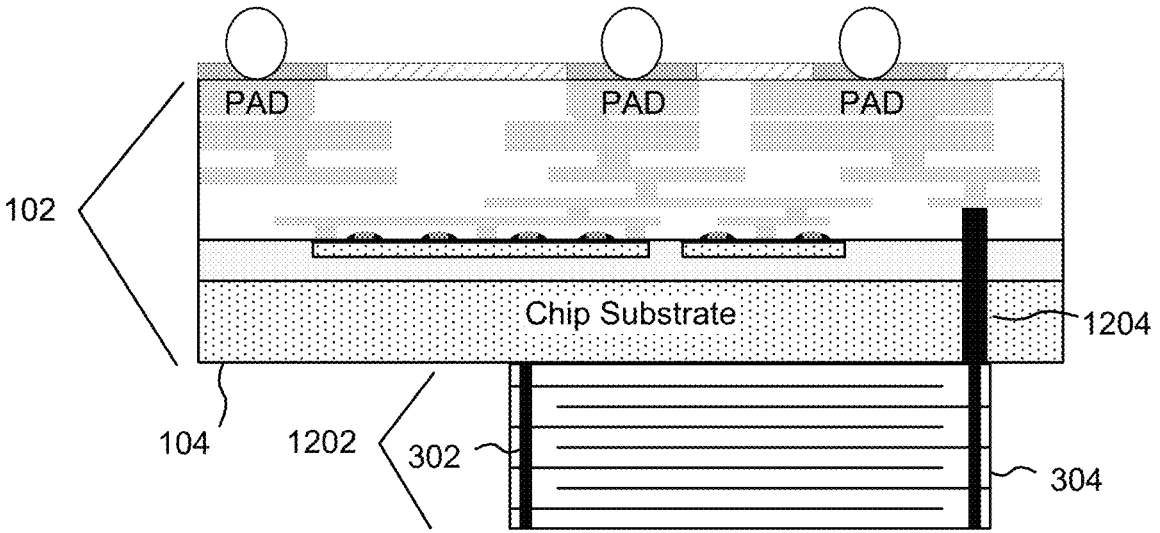
FIG. 12 is a stylized cross-sectional view of a back-side capacitor embodiment.

In some embodiments, a capacitor may be bonded to the back side of an IC chip 102. For example, FIG. 12 is a stylized cross-sectional view of a back-side capacitor embodiment. A capacitor 1202 is affixed in any desired manner (e.g., hybrid bonding, pillar bumps, etc.) to the backside substrate 104 of an IC chip 102 (i.e., the "bottom" of substrate 104 in FIG. 12). At least one of the main electrodes 302, 304 of the capacitor 1202 is placed in electrical contact with a corresponding TSV 1204 (noting that a TSV for main electrode 302 may be formed in the Z-direction of the IC chip 102 structure, into the figure page). In some applications, the capacitor 1202 may include through-vias that may be placed in electrical contact with a corresponding TSV (not shown).

Placement and affixation of the capacitor 1202 to the substrate 104 of the IC chip 102 may be by using die-to-die, die-to-wafer, or wafer-to-wafer techniques such as those described in this disclosure. The X-Y dimensions and Z height of the capacitor 1202 may be adjusted to meet capacitance and overall size requirements of a single chip solution.

The TSVs 1204 may be fabricated in a number of known ways. "Via-first" TSVs are fabricated before individual devices (transistors, capacitors, resistors, etc.) are patterned during FEOL processing. "Via-middle" TSVs are fabricated during FEOL processing after the individual devices are patterned but before BEOL processing. "Via-last" TSVs are fabricated as part of BEOL processing.

In some embodiments, the choice of capacitor connection may be provided in the IC chip 102 design, giving an end user the choice to use a large-valued affixed discrete embeddable capacitor or to skip adding the discrete embeddable capacitor in processing and instead connecting internally to an otherwise provided capacitor (e.g., a lower-valued internal MOM, MIM, or MOS capacitor). In a "via-last" approach, fabrication of the TSVs 1204 may be skipped if backside connection to a discrete embeddable capacitor is not needed.

Circuit Embodiments

Circuits and devices in accordance with the present invention may be used alone or in combination with other components, circuits, and devices. IC embodiments of the present invention may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 13:
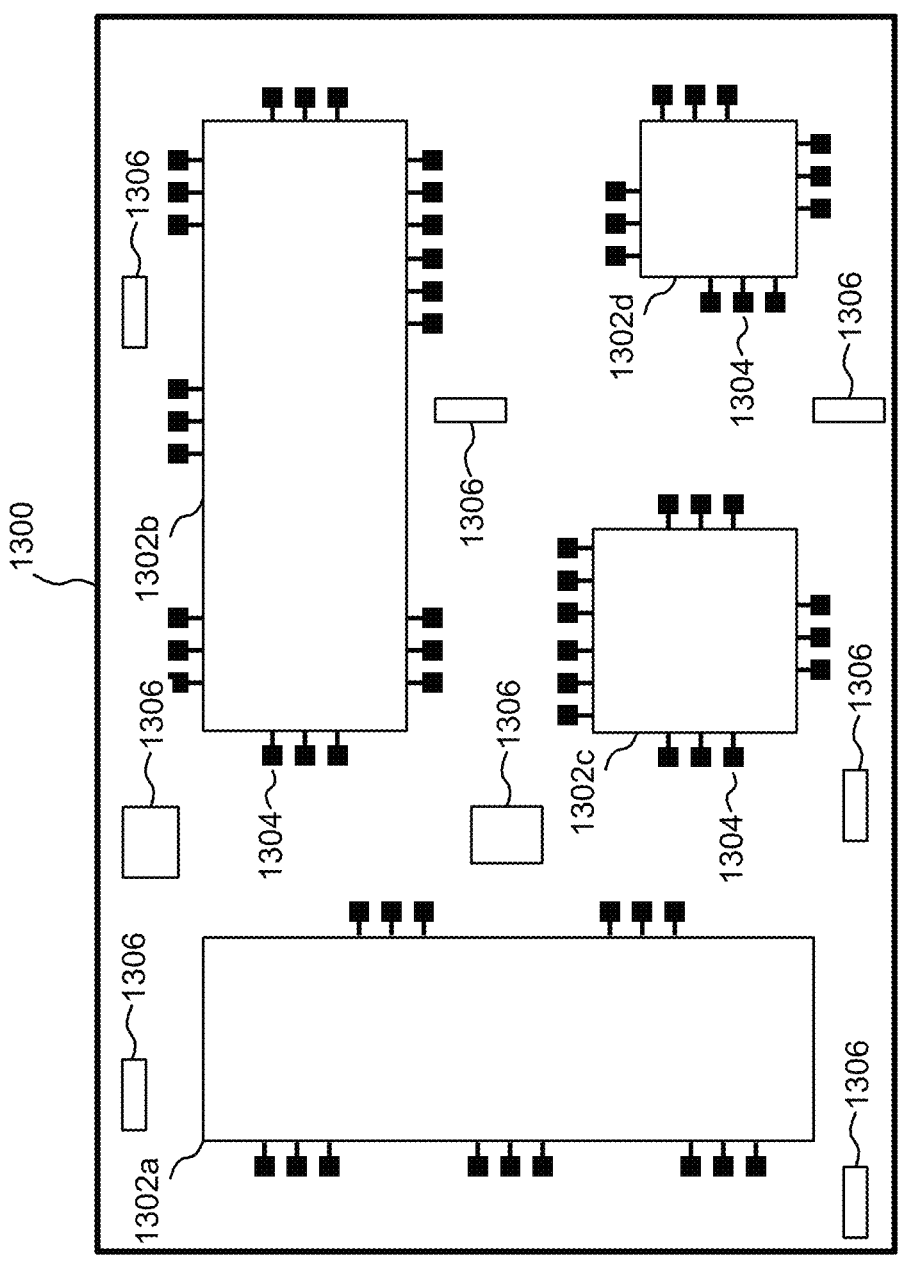
FIG. 13 is a top plan view of a multi-IC substrate that may be, for example, a printed circuit board or chip module substrate (e.g., a thin-film tile).

As one example of further integration of embodiments of the present invention with other components, FIG. 13 is a top plan view of a multi-IC substrate 1300 that may be, for example, a printed circuit board or chip module substrate (e.g., a thin-film tile). In the illustrated example, the substrate 1300 includes multiple ICs 1302a-1302d having terminal pads 1304 which would be interconnected by conductive vias and/or traces on and/or within the substrate 1300 or on the opposite (back) surface of the substrate 1300 (to avoid clutter, the surface conductive traces are not shown and not all terminal pads are labelled). The ICs 1302a-1302d may embody, for example, signal switches, active filters, amplifiers (including one or more LNAs), and other circuitry. For example, IC 1302b may be one or more instances of an IC chip having an affixed discrete embeddable capacitor as shown in FIG. 7, 8B, 8C, 9B, 10, 11A, or 12.

The substrate 1300 may also include one or more passive devices 1306 embedded in, formed on, and/or affixed to the substrate 1300. While shown as generic rectangles, the passive devices 1306 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1300 to other passive devices 1306 and/or the individual ICs 1302a-1302d. The front or back surface of the substrate 1300 may be used as a location for the formation of other structures.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Methods

Another aspect of the invention includes methods for integrating one or more discrete embeddable capacitors with an IC die to form a single chip.

For example, FIG. 14 is a process flow chart 1400 showing a method for affixing and electrically coupling a discrete embeddable capacitor to an integrated circuit chip. The method includes: affixing at least one discrete embeddable capacitor to a first surface of the IC chip (Block 1402); and electrically coupling the at least one discrete embeddable capacitor to internal circuitry of the IC chip (Block 1404).

As another example, FIG. 15 is a process flow chart showing a method for affixing and electrically coupling a discrete embeddable capacitor to two integrated circuit chips. The method includes: providing a first integrated circuit chip having a first surface and internal circuitry (Block 1502); providing a second integrated circuit chip having a first surface and internal circuitry (Block 1504); affixing at least one discrete embeddable capacitor to the first surface of the first integrated circuit chip and to the first surface of the second integrated circuit chip (Block 1506); and electrically coupling each discrete embeddable capacitor to the internal circuitry of at least one of the first integrated circuit chip and the second integrated circuit chip (Block 1508).

FIG. 16 is a process flow chart showing a method for making an integrated circuit chip structure. The method includes: providing an integrated circuit chip having a substrate and internal circuitry (Block 1602); forming one or more through-silicon vias through the substrate and to the internal circuitry (Block 1604); affixing at least one discrete embeddable capacitor to the substrate (Block 1606); and electrically coupling the at least one discrete embeddable capacitor to the internal circuitry through the one or more through-silicon vias (Block 1608).

Additional aspects of the above methods may include one or more of the following: wherein at least one of the at least one discrete embeddable capacitor is a multi-layer ceramic capacitor; wherein at least one of the at least one discrete embeddable capacitor includes main electrodes and through-vias electrically isolated from the main electrodes; wherein at least one of the at least one discrete embeddable capacitor includes internal main electrodes; wherein at least one of the at least one discrete embeddable capacitor includes through-vias electrically isolated from the main electrodes; wherein at least one of the at least one discrete embeddable capacitor includes internal main electrodes and, coupled to the main electrodes, respective bonding pads suitable for forming hybrid bonds; wherein at least one of the at least one discrete embeddable capacitor includes through-vias electrically isolated from the main electrodes; wherein at least one of the at least one discrete embeddable capacitor includes external main electrodes; wherein at least one of the at least one discrete embeddable capacitor includes through-vias electrically isolated from the main electrodes; wherein affixing the at least one discrete embeddable capacitor to the first surface of the IC chip precedes electrically coupling the at least one discrete embeddable capacitor to the internal circuitry; further including electrically coupling the at least one discrete embeddable capacitor to the internal circuitry through a redistribution layer; further including affixing each discrete embeddable capacitor individually to the first surface; further including electrically coupling the at least one discrete embeddable capacitor to the internal circuitry through a redistribution layer; further including affixing all of the discrete embeddable capacitors concurrently to the first surface by application to the first surface of a reconstituted wafer bearing the discrete embeddable capacitors; further including electrically coupling the at least one discrete embeddable capacitor to the internal circuitry through a redistribution layer; further including concurrently affixing the at least one discrete embeddable capacitor to the first surface and electrically coupling the at least one discrete embeddable capacitor to the internal circuitry; further including concurrently affixing the at least one discrete embeddable capacitor to the first surface and electrically coupling the at least one discrete embeddable capacitor to the internal circuitry by a hybrid bonding process; further including concurrently affixing the at least one discrete embeddable capacitor to the first surface and electrically coupling the at least one discrete embeddable capacitor to the internal circuitry by a pillar bump process; wherein at least one of the at least one discrete embeddable capacitor is partitioned into multiple capacitor cells; wherein the internal circuitry of the integrated circuit chip includes at least one switch electrically coupled to at least two capacitor cells and configured to connect the at least two capacitor cells in series; and/or wherein the internal circuitry of the integrated circuit chip includes at least two switches electrically coupled to at least two capacitor cells and configured to connect the at least two capacitor cells in parallel.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar junction transistors (BJTs), BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit chip structure including an integrated circuit chip having a first surface and internal circuitry, and including at least one discrete embeddable capacitor affixed to the first surface and electrically coupled to the internal circuitry, wherein at least one of the at least one discrete embeddable capacitor is internally partitioned into an array of capacitor cells and wherein the internal circuitry of the integrated circuit chip includes at least one of a switch or a fuse coupled to at least two capacitor cells of the array of capacitor cells and configured to electrically connect the at least two capacitor cells.

2. The integrated circuit chip structure of claim 1, wherein at least one of the at least one discrete embeddable capacitor is a multi-layer ceramic capacitor.

3. The integrated circuit chip structure of claim 1, wherein at least one of the at least one discrete embeddable capacitor includes main electrodes and through-vias electrically isolated from the main electrodes.

4. The integrated circuit chip structure of claim 1, wherein at least one of the at least one discrete embeddable capacitor includes internal main electrodes.

5. The integrated circuit chip structure of claim 4, wherein at least one of the at least one discrete embeddable capacitor includes through-vias electrically isolated from the internal main electrodes.

6. The integrated circuit chip structure of claim 1, wherein at least one of the at least one discrete embeddable capacitor includes internal main electrodes and, coupled to the internal main electrodes, respective bonding pads suitable for forming hybrid bonds.

7. The integrated circuit chip structure of claim 6, wherein at least one of the at least one discrete embeddable capacitor includes through-vias electrically isolated from the internal main electrodes.

8. The integrated circuit chip structure of claim 1, wherein at least one of the at least one discrete embeddable capacitor includes external main electrodes.

9. The integrated circuit chip structure of claim 8, wherein at least one of the at least one discrete embeddable capacitor includes through-vias electrically isolated from the external main electrodes.

10. The integrated circuit chip structure of claim 1, wherein the at least one discrete embeddable capacitor is affixed to the first surface, and then electrically coupled to the internal circuitry.

11. The integrated circuit chip structure of claim 10, wherein the at least one discrete embeddable capacitor is electrically coupled to the internal circuitry through a redistribution layer.

12. The integrated circuit chip structure of claim 10, wherein the at least one discrete embeddable capacitor is individually affixed to the first surface.

13. The integrated circuit chip structure of claim 12, wherein the at least one discrete embeddable capacitor is electrically coupled to the internal circuitry through a redistribution layer.

14. The integrated circuit chip structure of claim 10, wherein the at least one discrete embeddable capacitor is concurrently affixed to the first surface by application to first surface of a reconstituted wafer bearing the at least one discrete embeddable capacitor.

15. The integrated circuit chip structure of claim 14, wherein the at least one discrete embeddable capacitor is electrically coupled to the internal circuitry through a redistribution layer.

16. The integrated circuit chip structure of claim 1, wherein the at least one discrete embeddable capacitor is concurrently affixed to the first surface and electrically coupled to the internal circuitry.

17. The integrated circuit chip structure of claim 16, wherein the at least one discrete embeddable capacitor is concurrently affixed to the first surface and electrically coupled to the internal circuitry by a hybrid bonding process.

18. The integrated circuit chip structure of claim 16, wherein the at least one discrete embeddable capacitor is concurrently affixed to the first surface and electrically coupled to the internal circuitry by a pillar bump process.

19. The integrated circuit chip structure of claim 1, wherein the at least one of a switch or a fuse is configured to connect the at least two capacitor cells in series.

20. The integrated circuit chip structure of claim 1, wherein the internal circuitry of the integrated circuit chip includes at least two switches and/or fuses electrically coupled to at least two capacitor cells of the array of capacitor cells and configured to connect the at least two capacitor cells in parallel.

* * * * *